US012703929B2

(12) United States Patent
Allibert et al.

(10) Patent No.: US 12,703,929 B2
(45) Date of Patent: Aug. 11, 2026

(54) METHOD FOR MANUFACTURING A COMPOSITE STRUCTURE COMPRISING A THIN FILM OF MONOCRYSTALLINE SIC ON A CARRIER SUBSTRATE OF POLYCRYSTALLINE SIC

(71) Applicant: Soitec, Bernin (FR)

(72) Inventors: Frédéric Allibert, Bernin (FR); Eric Guiot, Bernin (FR)

(73) Assignee: Soitec, Bernin (FR)

( * ) Notice: Subject to any disclaimer, the term of this patent is extended or adjusted under 35 U.S.C. 154(b) by 332 days.

(21) Appl. No.: 18/693,491

(22) PCT Filed: Sep. 13, 2022

(86) PCT No.: PCT/FR2022/051717
§ 371 (c)(1),
(2) Date: Mar. 19, 2024

(87) PCT Pub. No.: WO2023/052704
PCT Pub. Date: Apr. 6, 2023

(65) Prior Publication Data
US 2024/0271321 A1 Aug. 15, 2024

(30) Foreign Application Priority Data
Sep. 29, 2021 (FR) ....................................... 2110273

(51) Int. Cl.
*C30B 25/20* (2006.01)
*C30B 28/14* (2006.01)
*C30B 29/36* (2006.01)

(52) U.S. Cl.
CPC .............. *C30B 25/20* (2013.01); *C30B 28/14* (2013.01); *C30B 29/36* (2013.01)

(58) Field of Classification Search
CPC .......... C30B 25/20; C30B 28/14; C30B 29/36
See application file for complete search history.

(56) References Cited

U.S. PATENT DOCUMENTS 5,322,802 A * 6/1994 Baliga .................... H10D 30/66 257/E21.057
8,476,891 B2 * 7/2013 Hikichi .................. G05F 3/242 323/901

(Continued)

FOREIGN PATENT DOCUMENTS

EP 3168862 B1 7/2022
TW 202121505 A 6/2021

(Continued)

OTHER PUBLICATIONS

Taiwan Office Action and Search Report for Application No. 111134354 dated Jan. 26, 2026, 8 pages with machine translation.

(Continued)

*Primary Examiner* — Robert M Kunemund
(74) *Attorney, Agent, or Firm* — TraskBritt

(57) ABSTRACT

A method of fabricating a composite structure includes providing a c-SiC initial substrate, depositing a relatively thin p-SiC first layer on a front side of the initial substrate at a relatively high temperature, the first layer having a dopant concentration greater than $10^{19}/cm^3$, forming a buried brittle plane in the initial substrate delineating a thin layer of single crystal SiC between the brittle plane and a front side of the initial substrate, depositing a relatively thick amorphous and/or polycrystalline SiC second layer on the first layer at a relatively low temperature, the second layer including dopants of the same type as those of the first layer, at a concentration greater than $10^{19}/cm^3$, and depositing a p-SiC third layer on the second layer at a relatively high temperature. A separation along the buried brittle plane takes place during the deposition process.

17 Claims, 3 Drawing Sheets

(56) References Cited

U.S. PATENT DOCUMENTS

| | | | | |
|---|---|---|---|---|
| 2017/0018634 | A1* | 1/2017 | Ward | H10D 12/441 |
| 2017/0365699 | A1* | 12/2017 | Choi | H10D 30/4732 |
| 2017/0365901 | A1* | 12/2017 | Hiramitsu | H01M 8/04932 |
| 2018/0277637 | A1* | 9/2018 | Meiser | H10D 62/8325 |
| 2020/0168460 | A1* | 5/2020 | Kuramata | C30B 29/16 |
| 2020/0321242 | A1* | 10/2020 | Hu | H10P 90/1916 |

FOREIGN PATENT DOCUMENTS

| | | | |
|---|---|---|---|
| WO | 2021/019137 | A1 | 2/2021 |
| WO | 2021/105575 | A1 | 6/2021 |
| WO | 2021/191512 | A1 | 9/2021 |

OTHER PUBLICATIONS

International Search Report for Application No. PCT/FR2022/051717 dated Dec. 23, 2022, 2 pages.

International Written Opinion for Application No. PCT/FR2022/051717 dated Dec. 23, 2022, 6 pages.

Mu et al., Room Temperature Wafer Bonding of Wide Bandgap Semiconductors, ECS Transactions, (2018), vol. 86, No. 5, pp. 3-21.

* cited by examiner

METHOD FOR MANUFACTURING A COMPOSITE STRUCTURE COMPRISING A THIN FILM OF MONOCRYSTALLINE SIC ON A CARRIER SUBSTRATE OF POLYCRYSTALLINE SIC

CROSS-REFERENCE TO RELATED APPLICATIONS

This application is a national phase entry under 35 U.S.C. § 371 of International Patent Application PCT/FR2022/051717, filed Sep. 13, 2022, designating the United States of America and published as International Patent Publication WO 2023/052704 A1 on Apr. 6, 2023, which claims the benefit under Article 8 of the Patent Cooperation Treaty of French Patent Application Serial No. FR2110273, filed Sep. 29, 2021.

TECHNICAL FIELD

The present disclosure relates to the field of semiconductors for microelectronic components. The disclosure, in particular, relates to a process for fabricating a composite structure comprising a thin layer made of single-crystal silicon carbide on a carrier substrate made of polycrystalline silicon carbide, and which exhibits relatively high electrical conductivity vertically between the thin layer and the carrier substrate.

BACKGROUND

Power devices and integrated power-supply systems based on single-crystal silicon carbide are able to manage a much higher power density in comparison with their conventional silicon equivalents, and to do so with active regions of smaller size. In order to further limit the size of power devices on SiC, it would be advantageous to fabricate vertical components rather than lateral components. To do this, vertical electrical conduction, between an electrode placed on the front side of the SiC structure and an electrode placed on the back side, must be permitted by the structure.

Single-crystal SiC substrates intended for the microelectronics industry remain expensive and difficult to mass produce, and it is advantageous to employ thin-layer transfer solutions, to produce composite structures typically comprising a thin layer made of single-crystal SiC on a less expensive carrier substrate. One well-known thin-layer transfer solution is the Smart Cut™ process, which is based on implantation of light ions and direct bonding. Such a process, for example, makes it possible to fabricate a composite structure comprising a thin layer made of single-crystal SiC (c-SiC), which layer is split from a donor substrate made of c-SiC, in direct contact with a carrier substrate made of polycrystalline SiC (p-SiC), and permitting vertical electrical conduction. Nevertheless, it remains difficult to achieve, by molecular adhesion, a good-quality direct bond between two c-SiC and p-SiC substrates, because management of the surface finish and roughness of the substrates is complex, and because the c-SiC and p-SiC are liable to have different polytypes.

Various methods derived from this process are also known in the prior art. For example, F. Mu et al. (ECS Transactions, 86 (5) 3-21, 2018) implement direct bonding after activation of the surfaces to be joined by bombardment with argon (SAB: "surface activation bonding"); such a treatment prior to bonding generates a very high density of dangling bonds, which promote the formation of covalent bonds at the joint, and hence a high bonding energy. Nevertheless, this method has the drawback of generating an amorphous layer, at the surface of the donor substrate made of single-crystal SiC, which unfavorably impacts the vertical electrical conduction between the thin layer made of c-SiC and the carrier substrate made of p-SiC.

Solutions for solving this problem have been proposed, in particular, in document EP 3 168 862, in which an implantation of dopant species into the amorphous layer is used to restore its electrical properties. The main drawback of this approach is its complexity and therefore its cost.

Moreover, document WO2021/019137 is known, which describes a process for fabricating a composite structure comprising a thin layer made of single-crystal silicon carbide placed on a carrier substrate made of polycrystalline silicon carbide, the process comprising:

- a step of provision of an initial substrate made of single-crystal silicon carbide,
- a first step of deposition at a temperature above 1000° C. to form an intermediate layer made of polycrystalline silicon carbide on the initial substrate, the intermediate layer having a thickness greater than or equal to 1.5 microns,
- a step of ion implantation of light species through the intermediate layer, to form a buried brittle plane in the initial substrate, delineating the thin layer between the buried brittle plane and the intermediate layer,
- a second step of deposition at a temperature above 1000° C. to form an additional layer made of polycrystalline silicon carbide on the intermediate layer, the intermediate layer and the additional layer forming the carrier substrate. A separation along the buried brittle plane takes place in the second deposition step, leading to the obtainment of the composite structure.

However, ion implantation through a thick intermediate layer made of p-SiC remains relatively complex and expensive because it involves implantation doses and energies that are far from standard.

The present disclosure relates to an alternative solution to those of the prior art, and aims to overcome all or some of the aforementioned drawbacks. It, in particular, relates to a process for fabricating a composite structure comprising a thin layer made of c-SiC placed on a carrier substrate made of p-SiC, and that exhibits relatively high electrical conductivity vertically between the thin layer and the carrier substrate.

BRIEF SUMMARY

The present disclosure relates to a process for fabricating a composite structure comprising a thin layer made of single-crystal silicon carbide placed on a carrier substrate made of polycrystalline silicon carbide, the process comprising:

a) a step of provision of an initial substrate made of single-crystal silicon carbide, b) a first step of deposition at a temperature above 1100° C. to form a first layer made of polycrystalline silicon carbide on a front side of the initial substrate, the first layer having a thickness smaller than 1 μm and a dopant concentration higher than $10^{19}/cm^3$, c) a step of ion implantation of light species through the first layer, to form a buried brittle plane in the initial substrate, delineating the thin layer between the buried brittle plane and the front side of the initial substrate, d) a second step of deposition at a temperature below 900° C. to form a second layer made of amorphous and/or polycrystalline silicon carbide on the first layer, the second layer having a thickness greater than or equal to 10 μm and a concentration of dopants, of the same type as those of the first layer, higher than $10^{19}/cm^3$, e) a third step of deposition at a temperature above 1000° C. to form a third layer made of polycrystalline silicon carbide on the second layer, the first layer, second layer and third layer forming the carrier substrate, a separation along the buried brittle plane taking place in the third deposition step.

According to other advantageous and non-limiting features of the present disclosure, which are applicable individually or in any technically feasible combination:

- the first deposition step and the third deposition step are carried out by chemical vapor deposition at a temperature between 1100° C. and 1600° C., preferably between 1200° C. and 1600° C., and more preferably between 1200° C. and 1400° C.;
- the first layer has a dopant concentration higher than $5\times10^{19}/cm^3$;
- at the end of the first deposition step, the first layer has a thickness between 50 nm and 500 nm, or even between 50 nm and 200 nm;
- the fabrication process comprises, before the first deposition step, a step of preparation of the initial substrate comprising at least one deoxidization of a front side of the initial substrate;
- the fabrication process comprises, before step b), a step a') of formation of an intermediate layer on the front side of the initial substrate with a view to promoting electrical conduction, the first layer then being formed on the intermediate layer in step b);
- the intermediate layer is made of silicon;
- the third layer formed in step e) has a thickness greater than or equal to 100 μm and a dopant concentration higher than $10^{19}/cm^3$, at least in its first one-hundred microns of thickness.

BRIEF DESCRIPTION OF THE DRAWINGS

Further features and advantages of the present disclosure will become apparent on reading the following detailed description of example embodiments of the present disclosure with reference to the appended figures, in which.

The figures are schematic representations that, for the sake of readability, have not been drawn to scale. In particular, the thicknesses of the layers along the z-axis are not to scale with respect to the lateral dimensions along the x- and y-axes; and the relative thicknesses of the layers with respect to one another are not respected in the figures.

DETAILED DESCRIPTION

Figure 1:
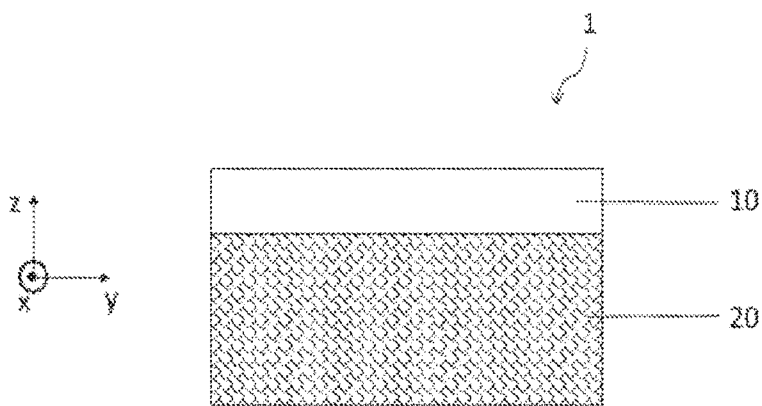
FIG. 1 shows a composite structure produced using a fabrication process according to the present disclosure.

The present disclosure relates to a process for fabricating a composite structure 1 comprising a thin layer 10 made of single-crystal silicon carbide placed on a carrier substrate 20 made of polycrystalline silicon carbide (FIG. 1).

Figure 2A:
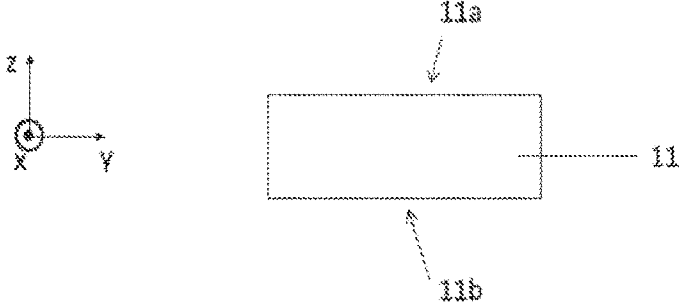
FIGS. 2A, 2B, 2C, 2D, 2E, 2E' and 2F show steps of a fabrication process according to the present disclosure.

The process first comprises a step a) of provision of an initial substrate 11 made of single-crystal silicon carbide (c-SiC) (FIG. 2A).

The initial substrate 11 preferably takes the form of a wafer having a diameter of 100 mm, 150 mm, 200 mm or even 300 mm, and a thickness typically between 300 and 800 microns. It has a front side 11*a* and a back side 11*b*. The surface roughness of the front side 11*a* is advantageously chosen to be lower than 1 nm Ra (average roughness), as measured by atomic force microscopy (AFM) in a scan of 20 μm×20 μm.

The thin layer 10 of the composite structure 1 will be formed, at the end of the process of the present disclosure, from the initial substrate 11; thus, the crystal orientation, crystal quality and doping level of the initial substrate 11 are chosen to meet the required specifications of the vertical components to be produced on the thin layer 10. For example, the initial substrate 11 is of 4H or 6H polytype, with an offcut angle of about 4.0° relative to the crystallographic axis <11−20>±0.5°, and a micropipe density lower than or equal to $5/cm^2$, or even lower than $1/cm^2$. Doped n-type (with nitrogen), it preferably has a resistivity between 0.015 ohm·cm and 0.030 ohm·cm. Advantageously, an initial substrate 11 having a low density of basal plane dislocations (BDPs), and typically a density of BPDs lower than or equal to $1500/cm^2$, will possibly be chosen, depending on the sensitivity of the targeted components to these defects.

Alternatively, the initial substrate 11 may comprise, on its front side 11*a*, a surface layer, which is, for example, produced by epitaxy, and which has the properties required for a future thin layer 10 that will be formed, at the end of the process of the present disclosure, from the surface layer.

Figure 2B:
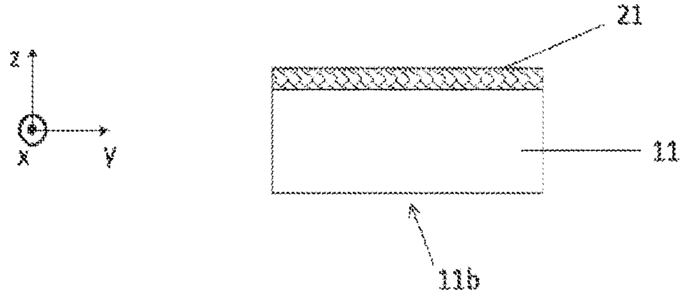

The process then comprises a step b), referred to herein as the first deposition step, to form a first layer 21 made of polycrystalline silicon carbide (p-SiC) on the front side 11*a* of the initial substrate 11 (FIG. 2B). It is noted that, in the context of the present description, the first layer 21 may be formed directly on the front side 11*a* of the initial substrate 11 or indirectly, i.e., via an intermediate layer that will then be inserted between the initial substrate 11 and the first layer 21. A variant involving such an intermediate layer is described below.

The first layer 21 has a thickness less than 1 μm. Advantageously, the thickness of this first layer 21 is less than or equal to 500 nm, and typically between 50 nm and 200 nm.

The first layer 21 further has a dopant concentration higher than $10^{19}/cm^3$. It is usually desirable for the dopants to be of the same type as the dopants of the future thin layer 10, and therefore, in the present case, of the same type as the dopants of the initial substrate 11. In composite SiC structures intended for power applications, the dopants are most often chosen to be n-type (doping with nitrogen, for example). The doping concentration of the first layer 21 is chosen to be between $10^{19}/cm^3$ and a few $10^{21}/cm^3$. In particular, the dopant concentration is higher than or equal to $5\times10^{19}/cm^3$, for example, higher than or equal to $3\times10^{20}/cm^3$, and may be between $4\times10^{20}/cm^3$ and $6\times10^{20}/cm^3$. Doping the polycrystalline silicon carbide to such a level will promote the obtainment of good electrical conduction between the thin layer 10 (which will be subsequently transferred from the initial substrate 11) and the carrier substrate 20 (which includes, inter alia, the first layer 21).

The p-SiC deposition of step b) is carried out at a temperature above 1100° C. The p-SiC deposition is advantageously carried out using a chemical-vapor-deposition (CVD) technique, for example, one based on chlorine-containing precursors, and at a temperature between 1100° C. and 1600° C. More advantageously, the deposition temperature may be between 1200° C. and 1600° C., and may be between 1200° C. and 1400° C. The parameters of the first deposition are determined such that the first layer 21 has, apart from its good electrical conductivity, which is due to it being highly doped and its uniformity in terms of polytype (advantageously 3C), a high thermal conductivity (typically, higher than or equal to 200 $W \cdot m^{-1} \cdot K^{-1}$) and a coefficient of thermal expansion similar to that of the future thin layer 10 (typically between 3.8E-6/K and 4.2E-6/K at room temperature).

The first deposition step b), because it is carried out at high temperature, or even very high temperature, promotes the formation of a SiC poly-crystal of good quality and having a low stress level, with structural characteristics compatible with the targeted electrical, thermal and mechanical properties.

By way of example, the first layer 21 will possibly comprise 3C SiC grains of 111 orientation and of 1 to 10 μm average size, and have a concentration of n-type dopants of about $5\times10^{20}/cm^3$ (equivalent to a resistivity of about 2 mohm·cm).

Advantageously, the fabrication process comprises, before step b), a step of preparation of the initial substrate 11 comprising at least one sequence of deoxidization of the front side 11*a* of the initial substrate 11. This sequence will, for example, possibly involve submergence in a bath of hydrofluoric acid (HF), exposure to HF vapor or even an anneal under hydrogen in the preliminary phase of the first deposition of p-SiC. The preparation step may also comprise cleaning sequences in order to remove all or some of the metal or organic particulate contaminants potentially present on the sides 11*a*, 11*b* of the initial substrate 11.

According to one variant, the process may comprise, before step b), a step a') of formation of an intermediate layer on the front side 11*a* of the initial substrate 11 with a view to promoting electrical conduction, the first layer 21 then being formed on the intermediate layer in step b).

Such an intermediate layer may, for example, be made of amorphous silicon or polysilicon, and optionally be highly doped the same type as the initial substrate 11. Other materials, able to form a good electrical contact between the first layer 21 and the initial substrate 11, may also be envisaged, such as titanium, nickel, aluminum, molybdenum, niobium, tantalum, cobalt or copper. The thickness of the intermediate layer is small, typically smaller than 20 nm, or even smaller than 10 nm.

Figure 2C:
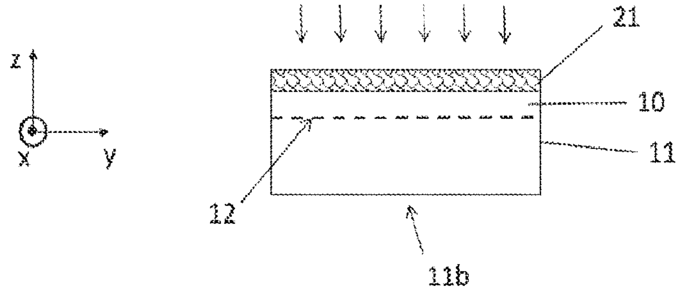

Returning to the general description, the fabrication process according to the present disclosure further comprises a step c) of ion implantation of light species through the first layer 21, to a given depth in the initial substrate 11. This implantation creates a buried brittle plane 12 in the initial substrate 11 (FIG. 2C).

The implanted light species are preferably hydrogen, helium or these two species co-implanted. As is well known (c.f. the Smart Cut™ process), these light species will form, around the given depth, microcavities distributed in a thin layer parallel to the free surface of the first layer 21, i.e., parallel to the plane (x,y) in the figures. This thin layer will be referred to herein as the buried brittle plane, for the sake of simplicity.

The buried brittle plane 12 delineates the future thin layer 10, with the front side of the initial substrate 11. The energy of implantation of the light species is chosen so that they pass through the first layer 21 and reach the given depth in the initial substrate 11, the depth corresponding to a thickness targeted for the thin layer 10. It remains within conventional implantation-energy ranges because of the small thickness of the first layer 21.

Typically, hydrogen ions will be implanted at an energy between 50 keV and 210 keV, and at a dose between $5E16/cm^2$ and $1E17/cm^2$, in order to pass through a first layer 21 of 50 nm to 1 μm and to delineate a thin layer 10 of about 100 to 1500 nm.

It will be noted that a protective layer will possibly be deposited on the free side of the first layer 21, prior to the ion implantation step, and be removed before step d), i.e., the following step of the process. This protective layer may be made up of a material such as silicon oxide or silicon nitride, for example.

Figure 2D:
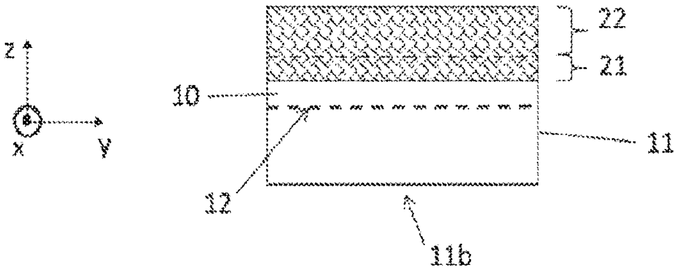

The fabrication process then comprises a step d), referred to herein as the second deposition step, to form a second layer 22 on the first layer 21 (FIG. 2D); this second layer 22 is formed from amorphous silicon carbide (a-SiC) or polycrystalline silicon carbide (p-SiC) or of a mixture of a-SiC and p-SiC.

The second deposition of a-SiC or p-SiC is carried out at a temperature lower than or equal to 900° C., and preferably lower than or equal to 800° C. The thermal budget of the second deposition is chosen so as to remain below the thermal budget of blistering or of splitting at the level of the buried brittle plane 12. In other words, the temperatures employed for the deposition of step d) and the deposition times prevent cavities and micro-cracks in the buried brittle plane 12 from growing thermally to the point that local deformation (blistering) of the stack of layers (thin layer 10, first layer 21, second layer 22) occurs, or to the point that partial delamination or separation via complete splitting over the entire length of the buried brittle plane 12 is induced.

Typically, the second deposition is carried out at 750-800° C., allowing a thickness of about 10-15 μm to be obtained for the second layer 22. A conventional chemical-vapor-deposition (CVD) technique will possibly be employed.

The second layer 22 has a thickness greater than or equal to 10 μm. This minimum thickness is defined to ensure that the second layer 22 is able to play a stiffening role permitting the application, in a subsequent step of the process, of a higher thermal budget, with a view to causing thermal growth of the cavities and micro-cracks in the buried brittle plane 12, as will be described below.

The second layer 22 further has a concentration of dopants of the same type as those of the first layer 21, higher than $10^{19}/cm^3$. The doping concentration of the second layer 22 is advantageously chosen between $5\times10^{19}/cm^3$ and a few $10^{20}/cm^3$, or even a few $10^{21}/cm^3$. The objective is to ensure a certain continuity in electrical conductivity between the first layer 21 and the second layer 22, even though the second layer 22 is of lower quality, because of its relatively low deposition temperature.

Figure 2E:
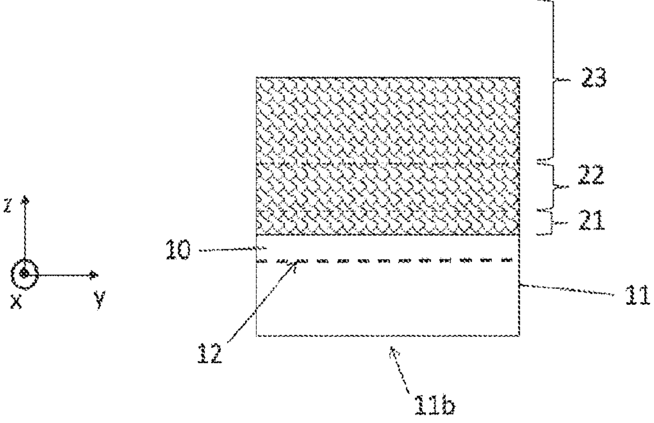
Figure 2E:
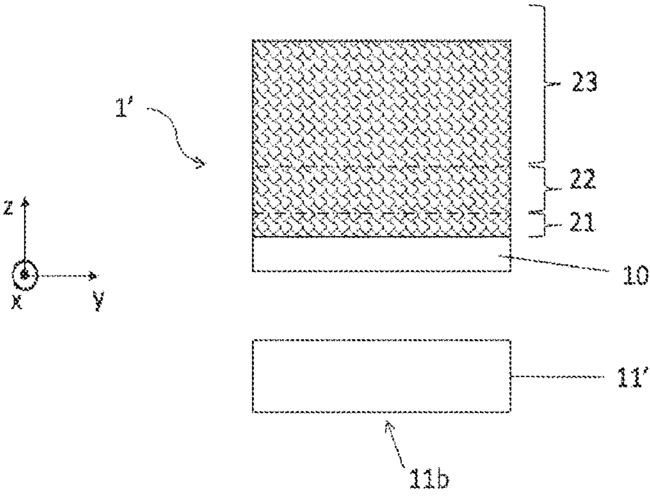

The fabrication process according to the present disclosure lastly comprises a step e), referred to herein as the third deposition step, to form a third layer 23 made of polycrystalline silicon carbide on the second layer 22 (FIG. 2E).

The third deposition is carried out at a temperature above 1000° C. in order to ensure a sufficient deposition rate. As with the first deposition (step b)), this third deposition is advantageously carried out using a chemical-vapor-deposition (CVD) technique, at a temperature between 1100° C. and 1600° C., and preferably between 1200° C. and 1600° C. The parameters of the third deposition are also determined so that the third layer 23 has a good electrical conductivity, a high thermal conductivity (higher than or equal to 200 $W \cdot m^{-1} \cdot K^{-1}$) and a coefficient of thermal expansion similar to that of the thin layer 10.

The temperature and the conditions of the third deposition will possibly be identical to or different from those of the first deposition in step b).

It is noted that if the second layer 22, deposited in the second deposition step, step d), is entirely or partially made of amorphous silicon carbide, the high-temperature step, step e), will cause the amorphous silicon carbide to crystallize into polycrystalline form.

Typically, the third layer 23 formed in step e) has a thickness greater than or equal to 100 μm, or even greater than or equal to 200 μm. The assembly made up of the first layer 21, the second layer 22 and the third layer 23 forms the p-SiC carrier substrate 20 of the composite structure 1. It is mainly the third layer 23 that gives the carrier substrate 20 its thickness and, therefore, its mechanical characteristics. The thickness of the third layer 23 is therefore adjusted to the specifications required for the carrier substrate 20.

The third layer 23 advantageously has a dopant concentration higher than $10^{19}/cm^3$, at least in its first one-hundred microns of thickness. The doping may be uniform through the thickness of the third layer 23 or the doping concentration may decrease gradually or abruptly beyond a certain thickness (for example, 100 μm, 150 μm, 200 μm or more) in order to limit stress in the layer and to simplify the deposition.

The type of dopants is chosen to be identical to those of the first layer 21 and of the second layer 22.

In the third deposition step, step e), because of the thermal budget applied to the structure formed by the initial substrate 11, the first layer 21 and the second layer 22, and the growing additional third layer 23, a separation will take place along the buried brittle plane 12 (FIG. 2E'). Specifically, the microcavities present in the buried brittle plane 12 grow until a splitting wave is initiated. The splitting wave will propagate across the entire extent of the buried brittle plane 12 and cause the assembly formed from the thin layer 10 and the first, second and third layers 21, 22, 23 to separate from the remainder 11' of the initial substrate 11.

The separation generally takes place before the third layer 23 reaches its target thickness, on account of the thermal budget of the third deposition, which is much higher than the thermal budget required for splitting to occur. Regardless of the thickness of the third layer 23 when separation takes place, the splitting wave will propagate across the entire extent of the buried brittle plane 12 because the second layer 22 alone is sufficiently thick to guarantee a stiffening effect: the cavities therefore do not cause the layer to blister. The thickness of the second layer 22 alone also allows the integrity of the intermediate composite structure 1' (FIG. 2E') to be maintained, avoiding flaking or the deterioration of the structure until the third layer 23 has been finished.

Figure 2F:
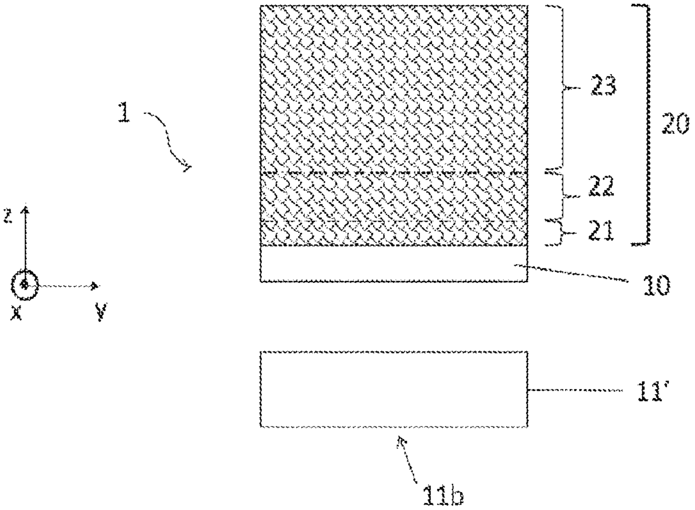

The third deposition may thus continue until the target thickness of the third layer 23 has been reached and the final composite structure 1 obtained (FIG. 2F).

Advantageously, and although this was not mentioned with reference to deposition steps b), d) and e) of the fabrication process, conventional surface-preparation steps may be carried out prior to the formation of the first layer 21, second layer 22 and/or third layer 23.

According to one advantageous embodiment, the fabrication process comprises finishing steps applied to the final composite structure 1 obtained at the end of step e). These finishing steps, in particular, aim to improve the roughness of the free surface of the thin layer 10 (front side of the final composite structure 1) and optionally the roughness of the free side of the third layer 23 (back side of the final composite structure 1).

Specifically, after separation, the free side of the thin layer 10 typically has a roughness between 3 nm and 6 nm Ra (AFM—20 μm×20 μm scan). The objective, as regards the subsequent fabrication of components, is to obtain a roughness lower than 1 nm Ra. Regarding the back side of the final composite structure 1, the roughness at the end of the third deposition is typically greater than 10 nm Ra, or even greater than 100 nm Ra; the targeted objective is usually to lower the roughness to less than 3 nm Ra.

The finishing steps may, in particular, employ known mechanical and/or chemical-mechanical polishing techniques, applied to the front side of the final composite structure 1, to its back side, or to both sides simultaneously using two-sided polishing equipment. The polishing process applied to the front side will possibly be different from that applied to the back side, different consumables usually being required to smooth a c-SiC surface and a p-SiC surface.

The finishing steps may also comprise heat treatments at high or very high temperature, and typically between 1500° C. and 1900° C., with a view to restoring the crystal quality and the electrical properties of the thin layer 10, and to increasing the uniformity of the structural characteristics of the various layers 21, 22, 23 of the carrier substrate 20.

The composite structure 1 according to the present disclosure has the advantage of exhibiting relatively high electrical conductivity between the thin layer 10 and the carrier substrate 20, and, in particular, the advantage of having an interface resistivity lower than $5\times10^{-5}$ ohm·cm$^2$, or even lower than or equal to $10^{-5}$ ohm·cm$^2$.

EXAMPLES

According to one non-limiting example of implementation, the initial substrate 11 provided in the first step of the fabrication process is a c-SiC wafer of 4H polytype, with an orientation of 4.0° relative to the axis <11−20>±0.5°, and with a diameter of 150 mm, a thickness of 350 μm and an average resistivity of 20 mOhm·cm.

A conventional cleaning sequence involving an RCA cleaning operation (Standard Clean 1+Standard Clean 2), followed by a cleaning operation in Caro's acid (mixture of sulfuric acid and hydrogen peroxide) and then a cleaning operation in HF (hydrofluoric acid) is carried out on the initial substrate 11 prior to the first deposition step. CVD deposition based on chlorine-containing precursors is carried out, at a temperature of 1300° C., on the front side 11*a* of the initial substrate 11, generating a p-SiC first layer 21 with a thickness of 500 nm and including n-type dopants (nitrogen) at a doping concentration of $5\times10^{20}/cm^3$. The resistivity at the deposition interface is on the order of $10^5$ ohm·cm$^2$.

The implantation of hydrogen ions is carried out at an energy of 200 keV and with a dose of 6E16 $H^+/cm^2$, through the free surface of the first layer 21. A buried brittle plane 12 is thus created at a depth of about 1.2 μm in the initial substrate 11.

A cleaning sequence consisting of RCA+Caro's acid cleaning operations is carried out on the structure so as to remove potential contaminants from the free side of the first layer 21.

A second CVD deposition of polycrystalline SiC or amorphous SiC or mixed p-SiC/a-SiC structure is performed on the first layer 21, at a temperature of 800° C., so as to achieve a thickness of 10 μm for the second layer 22. A concentration of n-type dopants (nitrogen) of $5\times10^{20}/cm^3$ is incorporated into the second layer 22 during the deposition.

A new cleaning sequence consisting of RCA+Caro's acid cleaning operations is carried out on the obtained structure, so as to remove potential contaminants from the free side of the second layer 22.

A third CVD deposition is performed on the second layer 22, at a temperature of 1300° C., so as to achieve a thickness of 350 μm for the third layer 23. The initial 100 μm of the third layer 23 are n-doped (doped with nitrogen) with a concentration of about $5\times10^{20}/cm^3$, then the doping is decreased as the growth progresses to reach $5\times10^{18}/cm^3$ at the targeted thickness of 350 μm.

The thermal budget of the third CVD deposition causes the second layer 22 to crystallize into polycrystalline form.

Separation takes place at the level of the buried brittle plane 12 during the third deposition. At the end of the third deposition, the composite structure 1 formed from the thin layer 10 and from the carrier substrate 20 has separated from the remainder 11' of the initial substrate 11.

Mechanical then chemical-mechanical polishing is carried out to restore the surface roughness of the p-SiC back side of the carrier substrate 20 (free side of the third layer 23). Typically, a thickness of p-SiC of about a few microns to a few tens of microns may be removed. Chemical-mechanical polishing is carried out to restore the surface roughness of the thin layer 10; here about a few tens to a few hundred nanometers is removed.

A heat treatment at 1700° C. for 30 minutes is applied to the composite structure 1 before or after the aforementioned chemical-mechanical polishing, carried out on the side of the thin layer 10.

Of course, the present disclosure is not limited to the embodiments or to the examples, which have been described, and variant embodiments can be added to it without departing from the scope of the invention as defined by the claims.

In particular, according to one contemplated variant, the thermal budget of the third CVD deposition is not high enough to cause the second layer 22 (entirely or partially amorphous during the second deposition) to crystallize, in its entirety, into polycrystalline form. In this case, an additional heat treatment is liable to be provided, in order to cause this crystallization, before or after the third deposition.

The invention claimed is:

1. A method of fabricating a composite structure including a thin layer of single-crystal silicon carbide on a carrier substrate of polycrystalline silicon carbide, the method comprising:

providing an initial substrate of single-crystal silicon carbide;

depositing a first layer of polycrystalline silicon carbide over a front side of the initial substrate at a temperature above 1100° C., the first layer having a thickness less than 1 μm and a dopant concentration greater than $10^{19}/cm^3$;

implanting light ionic species through the first layer to form a buried brittle plane in the initial substrate, the thin layer being delineated between the buried brittle plane and the front side of the initial substrate;

depositing a second layer of amorphous and/or polycrystalline silicon carbide on the first layer at a temperature below 900° C., the second layer having a thickness greater than or equal to 10 μm and a concentration of dopants, of the same type as a type of dopants of the first layer, the concentration of dopants in the second layer being greater than $10^{19}/cm^3$;

depositing a third layer of polycrystalline silicon carbide on the second layer at a temperature above 1000° C., a separation along the buried brittle plane occurring during the deposition of the third layer, the first layer, second layer and third layer forming the carrier substrate of the composite substrate.

2. The method of claim 1, wherein the deposition of the first layer and the deposition of the third layer are carried out using chemical vapor deposition at a temperature between 1100° C. and 1600° C.

3. The method of claim 2, further comprising forming the first layer to have a dopant concentration greater than $5\times10^{19}/cm^3$.

4. The method of claim 3, wherein, upon completion of the deposition of the first layer, the first layer has a thickness between 50 nm and 500 nm.

5. The method of claim 4, further comprising, deoxidizing the front side of the initial substrate before the deposition of the first layer.

6. The method of claim 5, further comprising forming an intermediate layer on the front side of the initial substrate before the deposition of the first layer, and wherein the deposition of the first layer comprises depositing the first layer on the intermediate layer.

7. The method of claim 6, further comprising forming the intermediate layer to be a silicon layer.

8. The method of claim 5, wherein the deposition of the third layer comprises forming the third layer to have a thickness greater than or equal to 100 μm and a dopant concentration greater than $10^{19}/cm^3$ at least in a region of the third layer adjacent the second layer having a thickness of one-hundred microns.

9. The method of claim 2, wherein the deposition of the first layer and the deposition of the third layer are carried out using chemical vapor deposition at a temperature between 1200° C. and 1600° C.

10. The method of claim 9, wherein the deposition of the first layer and the deposition of the third layer are carried out using chemical vapor deposition at a temperature between 1200° C. and 1400° C.

11. The method of claim 1, further comprising forming the first layer to have a dopant concentration greater than $5\times10^{19}/cm^3$.

12. The method of claim 1, wherein, upon completion of the deposition of the first layer, the first layer has a thickness between 50 nm and 500 nm.

13. The method of claim 12, wherein, upon completion of the deposition of the first layer, the thickness of the first layer is between 50 nm and 200 nm.

14. The method of claim 1, further comprising deoxidizing the front side of the initial substrate before the deposition of the first layer.

15. The method of claim 1, further comprising forming an intermediate layer on the front side of the initial substrate before the deposition of the first layer, and wherein the deposition of the first layer comprises depositing the first layer on the intermediate layer.

16. The method of claim 15, further comprising forming the intermediate layer to be a silicon layer.

17. The method of claim 1, wherein the deposition of the third layer comprises forming the third layer to have a thickness greater than or equal to 100 μm and a dopant concentration greater than $10^{19}/cm^3$ at least in a region of the third layer adjacent the second layer having a thickness of one-hundred microns.

* * * * *